United States Patent
Files et al.

(12) 
(10) Patent No.: US 10,382,660 B2
(45) Date of Patent: Aug. 13, 2019

(54) USING A LIGHT SOURCE TO TEMPORARILY SATURATE A CAMERA SENSOR OF A CAMERA CONNECTED TO A COMPUTER

(71) Applicant: Dell Products L. P., Round Rock, TX (US)

(72) Inventors: Jace W. Files, Round Rock, TX (US); John Trevor Morrison, Round Rock, TX (US)

(73) Assignee: Dell Products L. P., Round Rock, TX (US)

( * ) Notice: Subject to any disclaimer, the term of this patent is extended or adjusted under 35 U.S.C. 154(b) by 178 days.

(21) Appl. No.: 15/583,138

(22) Filed: May 1, 2017

(65) Prior Publication Data

US 2018/0316835 A1 Nov. 1, 2018

(51) Int. Cl.
*H04N 5/225* (2006.01)
*H01L 27/32* (2006.01)
(Continued)

(52) U.S. Cl.
CPC ....... *H04N 5/2256* (2013.01); *G06K 9/00255* (2013.01); *G06K 9/209* (2013.01); *G06K 9/2027* (2013.01); *G06K 9/228* (2013.01); *G06K 9/24* (2013.01); *H01L 27/3227* (2013.01); *H04N 5/2257* (2013.01); *H04N 7/142* (2013.01); *H01L 51/5275* (2013.01)

(58) Field of Classification Search
CPC .. H04N 5/2256; H04N 5/2257; H04N 5/2354; H04N 5/335; H04N 5/23203–232061; H04N 1/00204–00244; H04N 1/00838–00883; G03B 7/16; G03B 7/17; G03B 15/02–07; G03B 2215/05–0596; H01L 27/146–14698; H01L 51/50–56; H01L 51/0032–0095; G06K 9/20–348; G06F 21/00–88; G06F 2221/00–2153

See application file for complete search history.

(56) References Cited

U.S. PATENT DOCUMENTS

| | | | |
|---|---|---|---|
| 2010/0164344 A1* | 7/2010 | Boerner | H01L 25/048 313/1 |
| 2014/0286008 A1* | 9/2014 | Hack | F21K 9/90 362/249.01 |

(Continued)

*Primary Examiner* — Paul M Berardesca
(74) *Attorney, Agent, or Firm* — Campbell Stephenson LLP; Shiv S. Naimpally

(57) ABSTRACT

In some examples, a computing system may include a computing device, a display device, and a camera. The computing device includes a processor and a memory. The display device may be (1) separate from and electronically connected to the computing device or (2) integrated into the computing device. A camera may be connected to the computing device. The camera may be (1) a standalone device or (2) integrated into the display device. The camera may include a lens, a sensor, and a light source. For example, the light source may be a light emitting diode (LED) or an organic LED (OLED). Providing power to the light source causes the light source to emit an amount of light sufficient to saturate the imaging sensor such that if the camera is hijacked by a third party, the image data from the saturated sensor is distorted and unusable.

20 Claims, 12 Drawing Sheets

(51) Int. Cl.
*G06K 9/20* (2006.01)
*H04N 7/14* (2006.01)
*G06K 9/00* (2006.01)
*G06K 9/22* (2006.01)
*G06K 9/24* (2006.01)
*H01L 51/52* (2006.01)

(56) References Cited

U.S. PATENT DOCUMENTS

2014/0347555 A1* 11/2014 Hirakata ............... G03B 15/03
                                                  348/371
2015/0172522 A1*  6/2015 O'Neill ............... H04N 5/2252
                                                  348/240.3
2016/0323518 A1* 11/2016 Rivard .................. H04N 5/247
2017/0124942 A1*  5/2017 Evans, V ........... G02B 27/0093

\* cited by examiner

USING A LIGHT SOURCE TO TEMPORARILY SATURATE A CAMERA SENSOR OF A CAMERA CONNECTED TO A COMPUTER

BACKGROUND OF THE INVENTION

Field of the Invention

This invention relates generally to a computing device to which a camera is connected and, more particularly, to using a light source to saturate a sensor in the camera as security against a third party (e.g., hacker) hijacking the camera. Even if the third party is able to hijack the camera, the image data provided by the saturated sensor may be unusable.

Description of the Related Art

As the value and use of information continues to increase, individuals and businesses seek additional ways to process and store information. One option available to users is information handling systems (e.g., computing devices or computing systems). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many computer users employ a camera for applications, such as videoconferencing. To facilitate such applications, many computing devices, such as laptop computing devices, tablet computing devices, and wireless phones, integrate at least one (e.g., forward-facing) camera and sometimes two (e.g., forward-facing and rear-facing) cameras. In addition, users of a desktop computing device may connect an external camera suitable for applications such as videoconferencing.

A major concern for a user of a computing device that has a camera connected to the computing device, is camera security and privacy because such cameras can be easily hijacked by an unknown party, such as a hacker. For example, a hacker may remotely hijack a camera of a computing device to view confidential information (e.g., the user's user name and password) or to surreptitiously captures images (e.g., photographs or video) of the user in a potentially compromising situation. Because of how easily cameras connected to a computing device can be hijacked, many users take security precautions when the users are not using the camera. For example, the security precautions may prevent hackers from viewing or recording information even if the hackers manage to hijack the camera. However, these security precautions are typically crude, such as manually placing an opaque sticker over the camera. In addition, such solutions rely on the user remembering to manually perform the security precaution. If the user forgets to take the security precaution, e.g., because the user is pressed for time etc., then the user's camera may be vulnerable to being hijacked.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing system may include a computing device, a display device, and a camera. The computing device includes a processor and a memory. The display device may be (1) separate from and electronically connected to the computing device or (2) integrated into the computing device. A camera may be connected to the computing device. The camera may be (1) a standalone device or (2) integrated into the display device. The camera may include a lens, a sensor, and a light source. For example, the light source may be a light emitting diode (LED) or an organic LED (OLED). Providing power to the light source causes the light source to emit an amount of light sufficient to saturate the imaging sensor such that if the camera is hijacked by a third party, the image data from the saturated sensor is distorted and unusable.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
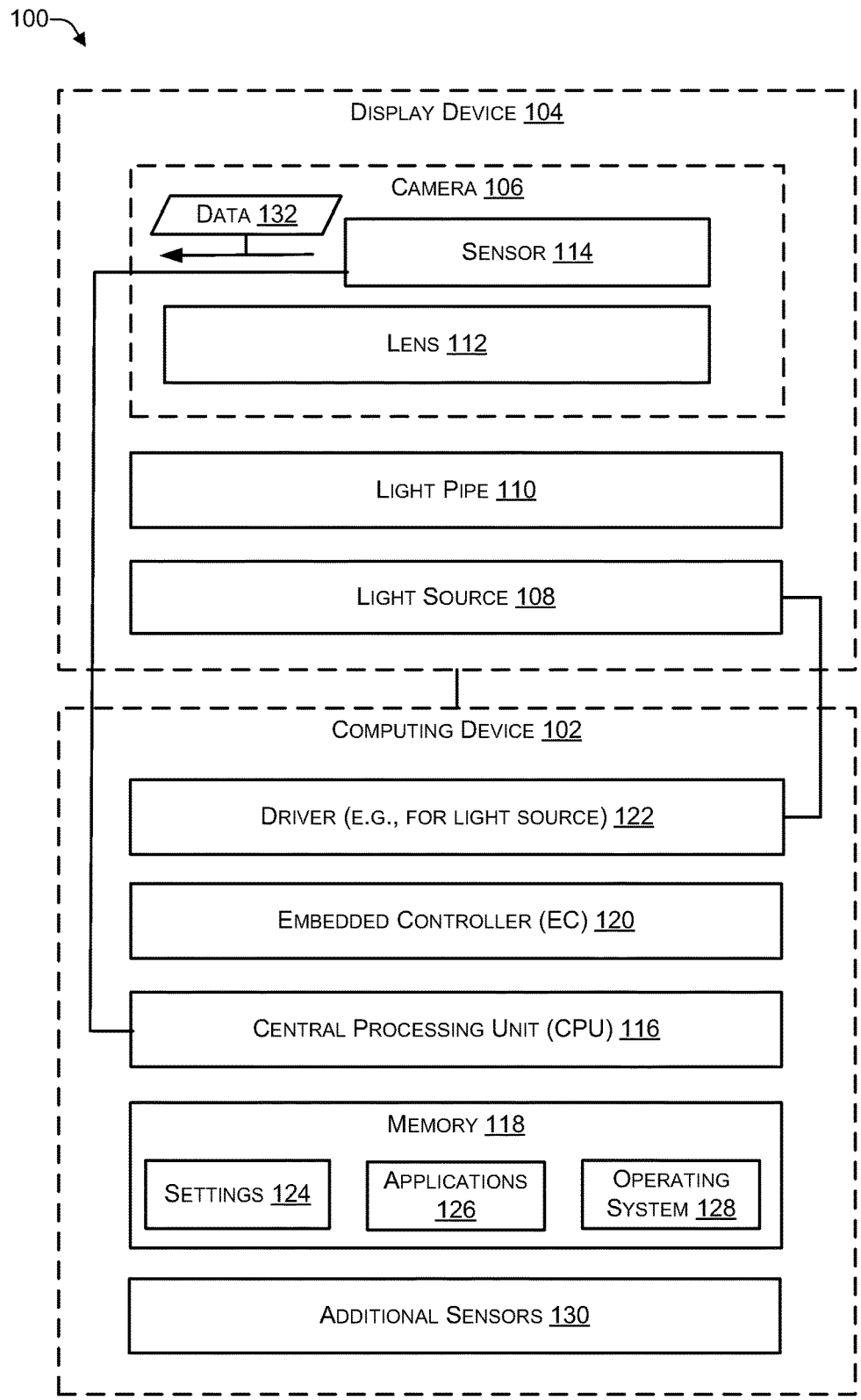
FIG. 1 is a block diagram of a computing system that includes a display device, a camera, and a light source according to some embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein may use a light source to saturate a sensor of a camera that is integrated into (or connected to) a computing device. Saturating the camera sensor may provide a security feature that prevents a hacker from discerning meaningful information from image data provided by the overloaded sensor even if the hacker is able to hijack the camera. The sensor may be saturated sufficiently that image data provided by the sensor is undecipherable. For example, when saturated, the image data may be a snow-like pattern, a monochrome image (e.g., a white image, a black image, or the like), or undecipherable shapes. The saturation is sufficient to prevent a hacker viewing the image data from the hijacked camera from viewing or capturing any usable information. For example, the hacker viewing the image data from the saturated sensor may be unable to discern what action(s) the user is performing and may therefore be unable to view passwords or other confidential information that the user is entering. Similarly, the hacker may be unable to capture viewable images or video of the user in a potentially compromising situation. When the camera's sensor is saturated, images or video captured by the hijacked camera may only include unrecognizable shapes.

The light from the light source may include visible spectrum light to enable the user to visually confirm that the security feature (e.g., saturating the camera sensor) is on. For example, when the security feature is on, the user may see a color (e.g., red, green, white, or another color) indicator that indicates that the light source is currently on and saturating the camera sensor. Thus, if the user desires to turn off the security feature (e.g., to use the camera), the user can visually confirm that the security feature has been turned off by observing that the color indicator is no longer visible. In some cases, the light source may emit both visible spectrum and light spectrum (e.g., infrared, ultraviolet, or the like) that is not visible to the human eye. For example, the visible spectrum portion of the light from the light source may provide the color indicator indicating that the security feature is enabled and the non-visible spectrum portion of the light from the light source, in combination with the visible light, be sufficient to saturate the camera sensor.

The camera may be integrated into a computing device (e.g., a tablet, a phone, a laptop, or the like) or the camera may be a standalone device that is connected to the computing device (e.g., a desktop computing device or a laptop computing device that does not have an integrated camera).

In some cases, a light pipe (or similar mechanism) may take light from a light source, such as a light emitting diode (LED) or the like, and carry the light to a lens of the camera to saturate the camera sensor. In other cases, an organic LED (OLED) may be applied over or around the camera lens to saturate the camera sensor. For example, a thin (0.2 mm or less) OLED film may be applied over (e.g., on top of) the camera lens. Alternately, if the OLED film adversely affects the image quality, the OLED film may include an opening through which the camera lens protrudes. In this way, the OLED film does not affect the image quality of the lens. Applying power to the OLED film may cause the OLED film to emit sufficient light as to saturate the camera sensor. The light emitted by the OLED film may provide the user with a visual indicator that the security feature (e.g., saturating the camera sensor) has been enabled.

In some cases, the OLED film may be manufactured with capacitive touch properties. For example, the user may touch the OLED film to turn the security on or off. To illustrate, when the OLED film is not emitting light, the user may touch the OLED film, causing power to be provided to the OLED film, causing the OLED film to emit light (e.g. security feature is on). When the OLED film is emitting light, the user may touch the OLED film to stop power from being provided to the OLED film, thereby causing the OLED film to no longer emit light (e.g. security feature is off).

The security feature may be turned on and off manually by the user or automatically by software applications. For example, the user may use an application (e.g., a control panel) to manually turn the security feature on or off. In addition, the security feature may be automatically (e.g., without human interaction) controlled by software applications. For example, during a login process, the operating system may automatically (e.g., without human interaction) disable the security feature to enable the camera to be used for login using a facial recognition application (e.g., Microsoft® Windows® Hello, Intel® RealSense®, or the like). For example, during the login, one or more images of the user who has powered on the computing device may be captured and the captured images compared to one or more previously stored images. If the captured images differ from the stored images by less than a predetermined amount, the user is logged in, otherwise the user is not allowed to login using facial recognition. After the login is completed, the operating system may check a settings file and then set the security feature on or off based on the settings file. For example, if the settings file indicates that the security feature is to be on (e.g., default setting) then, after the login process has been completed, the operating system may automatically turn the security feature on. When the user starts a type of application that uses the camera (e.g., a videoconferencing application, an image capture application used to capture photos or videos using the camera, or the like), the application may automatically (e.g., without human interaction) turn off the security feature.

The settings file may include one or more of a default setting, a user specified setting, or an override setting. The default setting may be a setting that is used when neither a user specified setting nor an override setting is present in the settings file. The user specified setting may be a setting that the user specifies. For example, a user who is concerned about security may set the user setting to "security feature on" such that the security feature is on except when turned off by the operating system (e.g., during login) or by an application, such as a video conferencing or image capture application. The override setting may be a setting specified by an information technology (IT) department of an enterprise (e.g., company) and used for computing devices provided to employees by the enterprise. For example, the enterprise may specify an override setting that the security feature remain on except when the camera is used for corporate videoconferencing. As another example, the enterprise may specify an override setting that the security feature remain on in certain locations. The operating system may use a global positioning satellite (GPS) sensor or other mechanism built in to the computing device to determine a location of the computing device. The settings file may identify locations (e.g., where confidential information that should not be made public is present) where the security feature is to be on and where the user is unable to manually turn off the security feature. For example, the override settings may turn the security feature on (and prevent the user and applications from turning off the security feature) in a research lab where intellectual property is being developed or where other confidential information is present. After the user exits the research lab and goes to a meeting room, the user may manually turn off the security feature or launch an application that turns off the security feature. In this way, the enterprise may (i) protect against industrial espionage, (ii) prevent others (e.g., hackers) from learning access codes to the enterprise's internal systems and networks.

In a first example, a computing system may include (i) a computing device, (ii) a display device, and (iii) a camera. The computing device may include a processor and a memory. The camera may include (i) a light source, (ii) a lens, and (iii) an imaging sensor. Providing power to the light source may cause the light source to emit an amount of light sufficient to saturate the imaging sensor. Image data provided by the saturated imaging sensor may include unrecognizable information and may therefore be unusable. The light source may be a light emitting diode (LED), an organic LED (OLED) film, or another type of light source. In some cases, the OLED film may be geometrically shaped (e.g., circle, square, triangle, or the like) and placed over the lens. In other cases, the OLED film may be geometrically shaped and include an opening (e.g., a hole) through which the lens protrudes, enabling the OLED film to be placed around the lens. A thickness of the OLED film may be 0.2 millimeters or less. In some cases, the OLED film may have a capacitive sensing property such that touching the OLED film may cause the OLED film to transition (i) from an on state to an off state when the OLED film is emitting light or (ii) from an off state to an on state when the OLED film is not emitting light. If the light source is not an OLED film, a light pipe may be used to transport light from the light source (e.g., LED) to a location that is sufficiently near the lens to cause the sensor to be saturated when the light source is emitting light. In some cases, the camera may be a standalone device that is connected to the computing device. In other cases, the camera may be either (i) integrated into a bezel of the display device or (ii) integrated into a display surface of the display device.

In a second example, a computing device may include a processor, a memory storing computer executable instructions (e.g., an operating system and one or more applications) and data (e.g., one or more settings), a display device, and a camera. The camera may include a lens, an imaging sensor, and an OLED film. Providing power to the OLED film may cause the OLED film to emit an amount of light sufficient to saturate the imaging sensor. Image data provided by the saturated imaging sensor may include unrecognizable information that is unusable for any purpose. For example, someone (e.g., a hacker) viewing the image data is not able to identify account information (e.g., username and password) or other sensitive/confidential information from the image data. The operating system may temporarily prevent power from being provided to the OLED film during a login process to enable the login process to use the camera to perform facial recognition. For example, a facial recognition login process (e.g., part of the operating system) may capture one or more current images of the user and compare the current images with one or more previously stored images of the user. If the current images differ from the previously stored images by less than a threshold amount, the user may be logged in by the operating system. If the current images differ from the previously stored images by at least the threshold amount, the user may not be logged in using facial recognition. After the login process is complete, the operating system may access a settings file and provide (or stop providing) power to the OLED film based at least in part on one or more settings in the settings file. For example, the settings file may include at least one of the following settings: (i) an override setting that specifies one or more conditions that, when satisfied, cause the operating system to provide the power to the OLED film, (ii) a user setting that specifies when to apply the power to the OLED film, wherein when the override setting is included in the settings file, the override setting is used by the operating system instead of the user setting to determine when to provide the power to the OLED file, or (iii) a default setting that specifies when to apply the power to the OLED film when the settings file does not include (i) the user settings and (ii) the override settings. As another example, the override setting may include conditions, such as particular locations, where the OLED film is not to be provided power to enable the camera to be used for applications that use the camera. The one or more applications may include at least one of a video conferencing application or an image capture application and may be capable of instructing the operating system to stop providing power to the OLED film to enable the applications to use the camera to participate in a video conference, view or capture image data, or the like. The OLED film may be geometrically shaped and may be placed over or around the lens. In some cases, the OLED film has a capacitive sensing property such that touching the OLED film causes the OLED film to change from a first state to a second state. For example, if the OLED film is on (e.g., first state=emitting light), touching the OLED film may cause the power to be cut off, causing the OLED film to go off (e.g., second state=stop emitting light). If the OLED film is off (e.g., first state=not emitting light), touching the OLED film may cause the power to be provided to the OLED film, causing the OLED film to turn on (e.g., second state=emit light).

In a third example, a computing device may include a processor, a memory, a display device, and a camera. The camera may include a lens, an imaging sensor, and OLED film that, when provided power, emits an amount of light sufficient to saturate the imaging sensor. The light emitted by the OLED film may provide a visual indication that the light source is causing the imaging sensor to be saturated. For example, the light emitted by the OLED film may include a band of frequencies (e.g., in the range of about 430 to about 770 terahertz (THz)) that are visible to a user. In some cases, touching the OLED film may cause a capacitance sensing property of the OLED film to turn the OLED film on (e.g., if the OLED film was previously off) or off (e.g., if the OLED film was previously on).

FIG. 1 is a block diagram of a computing system 100 that includes a display device, a camera, and a light source according to some embodiments. For example, a computing device 102 may be connected to a display device 104. When the computing device 102 comprises a desktop computer, the display device 104 may be in a first housing and the computing device 102 may be in a second housing that is separate from the first housing. In a laptop computer, the display device 104 may be in a first housing and the computing device 102 may be in a second housing that is attached to the first housing. In a tablet computer or wireless phone, the display device 104 may be integrated with the computing device 102 in a single housing.

Figure 7:
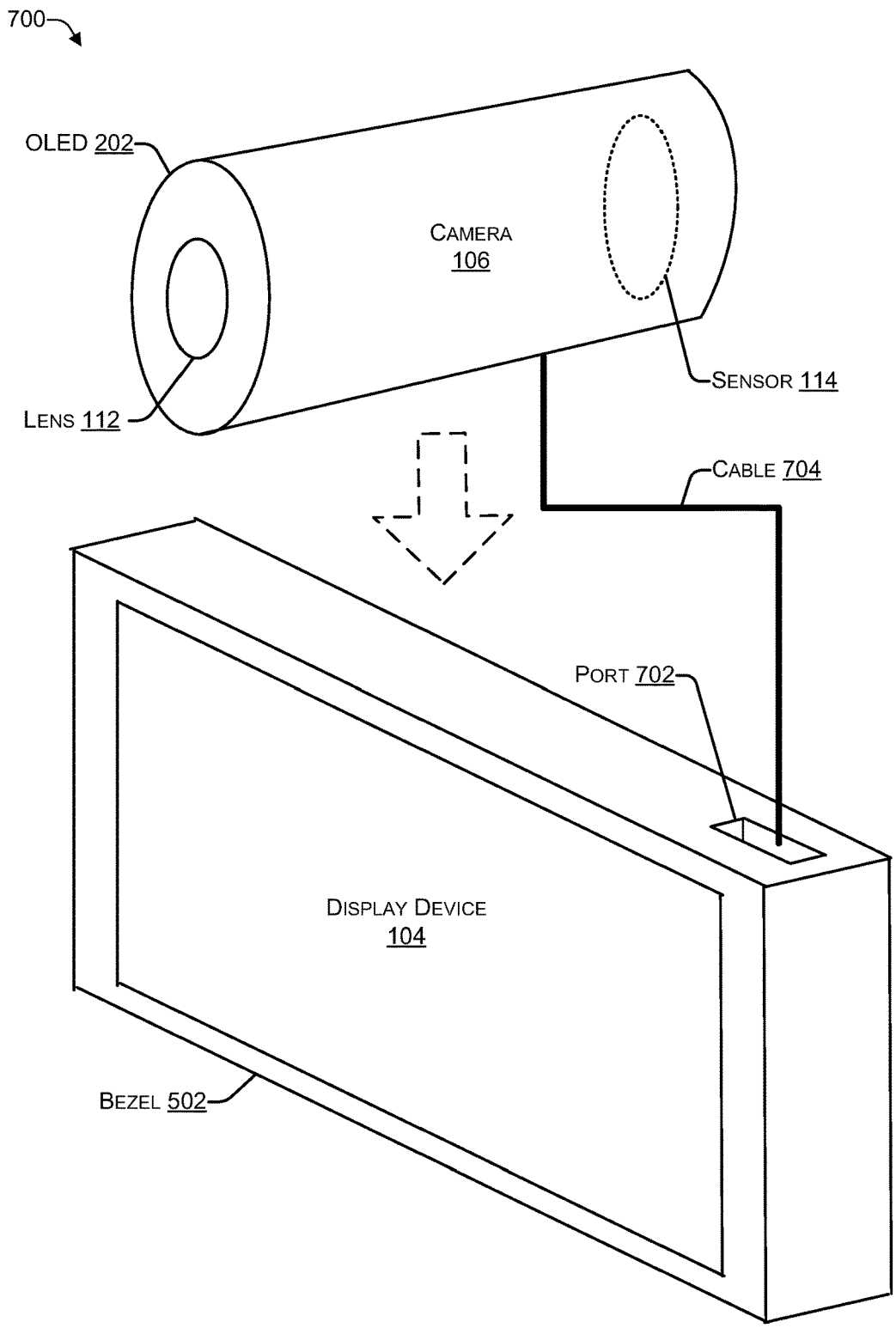
FIG. 7 is a block diagram of a camera that includes an OLED film and that is connected to a computing device according to some embodiments.

The display device 104 may include a camera 106 and a light source 108. In some cases (e.g., depending on the type of the light source 108), a light pipe 110 may be used to carry light emitted by the light source 108 to the camera 106. The camera 106 may include a lens 112 and a sensor 114 that receives an image (or series of images in the case of video) from the lens 112 and converts the image (or series of images) into digital image data 132 that is sent to the computing device 102 for storage and/or transmission to another computing device. The camera 106 may be integrated into the display device 104 (e.g., as illustrated in FIG. 1) or the camera 106 may be a standalone device that is connected (e.g., using universal serial bus (USB), Bluetooth®, or the like) to the computing device 102 (e.g., as illustrated in FIG. 7). While a single representative camera 106 is illustrated, it should be understood that the systems and techniques described herein may be used with a computing device to which multiple cameras are connected. For example, in some cases, a tablet computing device or wireless phone may have both a front-facing camera and a rear-facing camera. In such cases, the systems and techniques described herein to provide security may be used on one or both cameras.

The computing device 102 may include a central processing unit (CPU) 116, a memory 118, an embedded controller 120, and a hardware driver 122 (e.g., for the light source 108). The memory 118 may include one or more settings 124 (e.g., default setting, user setting, override setting, and the like), one or more software applications (e.g., image capture application, videoconferencing application, and the like), and an operating system 128 (e.g., Windows®, Android®, Linux®, MacOS®, or the like). The applications 126 and operating system 128 may include software instructions that are executable by the CPU 116. The computing device 102 may include one or more additional sensors 130, such as a location sensor (e.g., Global Positioning Satellite (GPS)), that can provide information to determine a location of the computing device 102.

The embedded controller 120 may receive instructions from the CPU 116. The instructions may cause the embedded controller 120 to provide power to the light source 108 causing the light source 108 to emit light and saturating the sensor 114, thereby preventing a hacker from capturing or viewing useful information from the data 132 if the hacker hijacks the camera 106. For example, the EC 120 may provide power to the driver 122, causing the light source 108 to emit light. The instructions may cause the embedded controller 120 to stop providing power to the light source 108 causing the light source 108 to stop emitting light, thereby enabling use of the camera 106.

The EC 120 may control a security feature that causes the light source 108 to emit light (or stop emitting light) near the lens 112. The light emitted by the light source 108 may be sufficient to saturate the image sensor 114. Thus, the security feature is enabled (on) when power is provided to the light source 108, causing the light source 108 to emit enough light to saturate the sensor 114. The security feature is disabled (off) when power is not provided to the light source 108, causing the light source 108 to not emit light, enabling the sensor 114 to provide digital image data for use by the applications 126 or the operating system 128. Saturating the sensor 114 may provide the security feature to prevent a hacker from discerning meaningful information from the image data 132 provided by the overloaded sensor 114 even if the hacker is able to hijack the camera 106. The sensor 114 may be saturated sufficiently that the image data 132 is undecipherable. For example, when saturated, the image data 132 may be a snow-like pattern, a monochrome image (e.g., a white image, a black image, or the like), or undecipherable shapes. The saturation is sufficient to prevent a hacker viewing the image data 132 from the hijacked camera 106 from viewing or capturing any usable information. For example, the hacker viewing the image data 132 from the saturated sensor 114 may be unable to discern what action(s) the user is performing and may therefore be unable to view passwords or other confidential information that the user is entering. Similarly, the hacker may be unable to capture usable images or video of the user in a potentially compromising situation because when the camera's sensor 114 is saturated, the image data 132 captured by the hijacked camera 106 may only include unrecognizable shapes.

The light emitted by the light source 108 may include visible spectrum light (e.g., in the range of about 430 to about 770 THz) to enable the user to visually confirm that the security feature (e.g., saturating the camera sensor) is on. For example, when the security feature is on, the user may see a color (e.g., red, green, white, or another color) indicator (e.g., in the light emitted by the light source 108) that indicates that the light source 108 is currently on and saturating the camera sensor 114. Thus, if the user desires to turn off the security feature (e.g., to use the camera 106), the user can visually confirm that the security feature has been turned off by observing that the color indicator is no longer visible (e.g., because the light source 108 is no longer receiving power and therefore no longer emitting light). In some cases, the light source 108 may emit both visible spectrum and spectrum that is not visible to the human eye, such as infrared (e.g., from about 430 THz to about 300 gigahertz (Ghz)) or ultraviolet (e.g., from about 30 petahertz (PHz) to about 750 Thz). For example, the visible spectrum portion of the light from the light source 108 may provide the color indicator indicating that the security feature is enabled and the non-visible spectrum portion of the light from the light source 108 may, in combination with the visible light, be sufficient to saturate the camera sensor 114.

The light source 108 may be one or more light emitting diodes (LED) or the like. For particular types of light sources, such as LEDs, a light pipe 110 (or a similar mechanism) may take light from the light source 108 and carry the light to the lens 112 to saturate the camera sensor 114.

The security feature may be turned on and off manually by the user or automatically by the operating system 128 and the software applications 126. For example, the user may use an application (e.g., a control panel of the applications 126) to manually turn the security feature on or off. In addition, the security feature may be automatically (e.g., without human interaction) controlled by the operating system 128 and the software applications 126. For example, during a login process, the operating system 128 may automatically (e.g., without human interaction) disable the security feature (e.g., disable power to the light source 108 to stop the light source 108 from emitting light) to enable the camera 106 to be used for login using a facial recognition application (e.g., Microsoft® Windows® Hello, Intel® RealSense®, or the like). After the login is completed, the operating system 128 may check the settings 124 and set the security feature on or off based on the settings 124. For example, if the settings 124 indicate that the security feature is to be on (e.g., default setting, user setting, or override setting) then, after the login process has been completed, the operating system 128 may automatically turn the security feature on (e.g., provide power to the light source 108 to cause the light source 108 to emit light and saturate the sensor 114). When the user starts applications 126 that use the camera 106 (e.g., a videoconferencing application, an image capture application used to capture photos or videos using the camera, or the like), the applications 126 may automatically (e.g., without human interaction) turn off the security feature.

The settings 124 may include one or more of a default setting, a user setting, an override setting, another type of setting for the security feature, or any combination thereof. The settings may be applied hierarchically. For example, the override setting may take precedence over the user setting and the default setting, and the user setting may take precedence over the default setting. The default setting for the security feature may be a setting that is used when neither a user setting nor an override setting are present in the settings file. The user setting may be a setting that the user specifies and may be used when an override setting is not present in the settings file. The user setting may be used even if a default setting is present. For example, a user who is concerned about security may set the user setting to "security feature on" such that the security feature is on except when turned off by the operating system (e.g., during login) or by an application, such as a video conferencing or image capture application. The override setting may be a setting specified by an information technology (IT) department of an enterprise (e.g., company) and used for computing devices provided to employees by the enterprise. For example, the enterprise may specify an override setting that the security feature remain on except when the camera 106 is used for corporate videoconferencing. As another example, the enterprise may specify an override setting that the security feature remain on in certain locations. The operating system 128 may use one of the additional sensors 130 (e.g., a global positioning satellite (GPS) sensor) to determine a location of the computing device 102. The settings 124 may identify locations (e.g., where confidential information that should not be made public is present) where the security feature is to be turned on and where the user is unable to manually turn off the security feature. In some cases, the operating system 128, the applications 126, or both may be unable to turn off the security feature. For example, the override settings may turn the security feature on and may prevent the user, the operating system 128, and the applications 126 from turning off the security feature in a particular location, such as a research lab where intellectual property is being developed or where other confidential information is present. After the user exits the research lab and goes to a meeting room, the user may manually turn off the security feature or launch an application that turns off the security feature. In this way, the enterprise may (i) protect against industrial espionage, (ii) prevent others (e.g., hackers) from learning access codes to the enterprise's internal systems and networks.

In some cases, the override settings may be located in a firmware (e.g., basic input output system (BIOS)) or a hardware component (e.g., in read-only memory) of the computing device 102 to prevent the override settings from being modified or deleted. In other cases, the override settings may be located in the memory 118 and may have access privileges set such that the override settings are read-only to prevent the override settings from being modified or deleted.

Thus, a light source (e.g., LED or the like) may be placed near a lens of a camera that is integrated into a display device connected to (or integrated into) a computing device. A security feature, when turned on, may provide power to the light source, causing the light source to emit light. The amount of light that is emitted by the light source may saturate a sensor of the camera. The security feature, when turned on, may prevent a hacker who has hijacked the camera from viewing or capturing any data that is useful to the hacker. For example, the hacker may be unable to identify passwords from data provided by the camera and may be unable to capture compromising images of the user due to the light saturating the camera sensor. At least some of the light that is emitted may include a light spectrum that is visible to the human eye, thereby providing the user with a visual indicator that indicates when the security feature is on and when the security feature is off.

Figure 2:
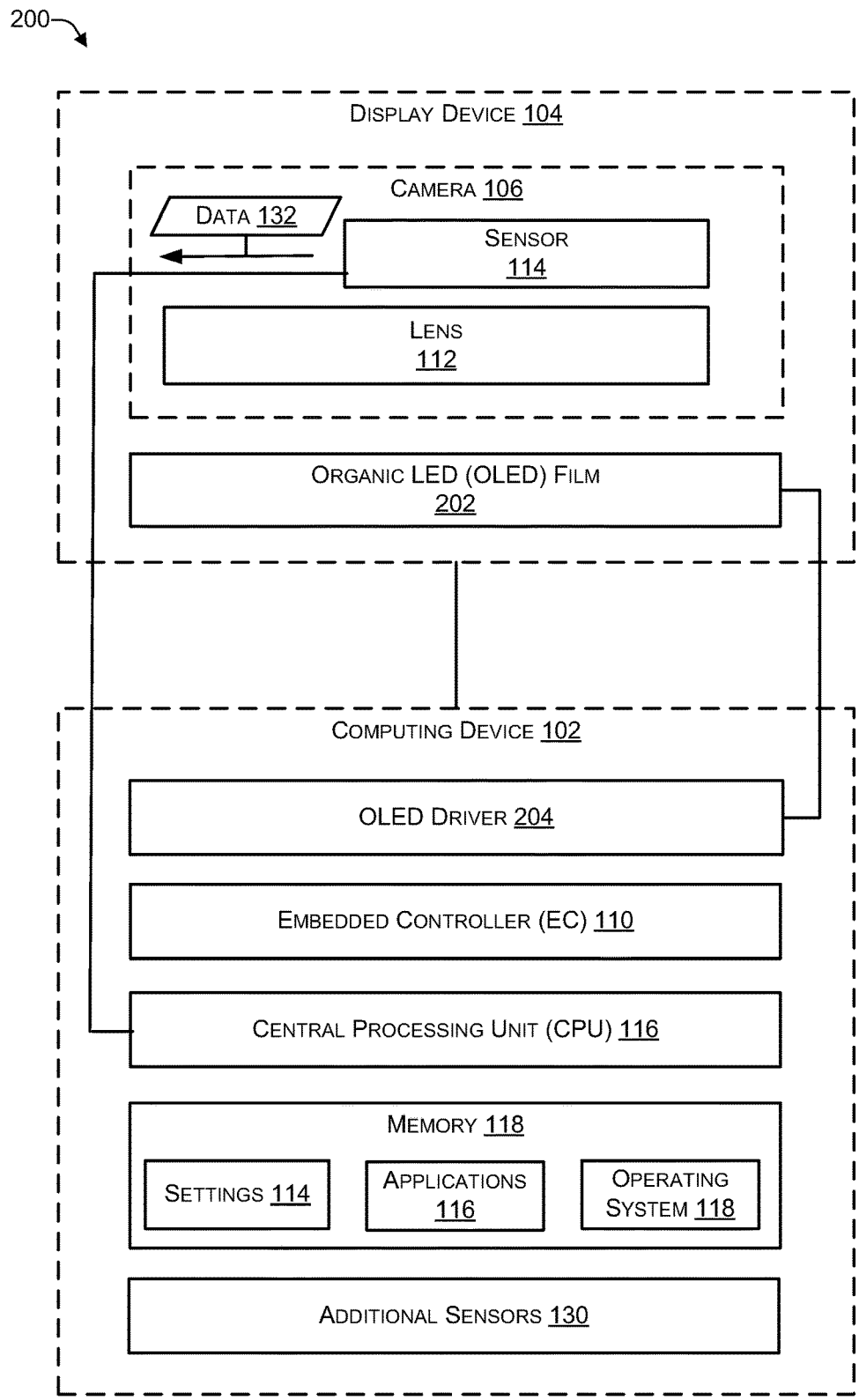
FIG. 2 is a block diagram of an architecture of a computing device that includes an organic light emitting diode (LED) according to some embodiments.

FIG. 2 is a block diagram of an architecture 200 of a computing device that includes an organic light emitting diode (LED) according to some embodiments. FIG. 2 illustrates a variation of the architecture 100 of FIG. 1 in which the light source 108 of FIG. 1 comprises an OLED film 202. The OLED film 202 may be applied over or around the lens 112. Therefore, when the OLED film 202 is used, the light pipe 110 of FIG. 1 may not be used. In FIG. 2, the driver 122 of FIG. 1 may comprise an OLED driver 204.

The OLED film 202 may be applied over or around the lens 112. For example, if applying the OLED film 202 over the lens 112 does not discernably or measurably degrade an image quality of the data 132, then the OLED film 202 may be applied over the lens 112. Discernably means a user is unable to see a difference between a first image taken when the OLED film 202 is not applied and a second image taken when the OLED film 202 is applied. Measurably means a first image taken when the OLED film 202 is not applied may be determined to differ from a second image taken when the OLED film 202 is applied by less than a predetermined amount. If applying the OLED film 202 over the lens 112 discernably or measurably degrades the image quality of the data 132, then the OLED film 202 may be applied around the lens 112. For example, a circular shaped (or other geometrically shaped) OLED film 202, with an opening (e.g., a hole) in the middle to accommodate the lens 112, may be applied.

In some cases, the OLED film 202 may be manufactured with capacitive touch properties, enabling the user to touch the OLED film 202 to turn the security on or off. To illustrate, when the OLED film 202 is not emitting light, the user may touch the OLED film 202, causing power to be provided to the OLED film 202, causing the OLED film 202 to emit light (e.g. security feature is on). When the OLED film 202 is emitting light, the user may touch the OLED film 202 to stop power from being provided to the OLED film 202, thereby causing the OLED film 202 to stop emitting light (e.g. security feature is off).

The security feature, the settings 114, and other operations of the computing device 102 and the display device 104 operate in FIG. 2 as previously described in FIG. 1.

Thus, an OLED film may be applied over or around a lens of a camera that is integrated into a display device connected to (or integrated into) a computing device. A security feature, when turned on, may provide power to the light source (e.g., OLED film), causing the light source to emit light. The amount of light that is emitted by the light source may saturate a sensor of the camera. The security feature, when turned on, may prevent a hacker who has hijacked the camera from viewing or capturing any data that is useful to the hacker. For example, the hacker may be unable to identify passwords from data provided by the camera and may be unable to capture compromising images of the user due to the light saturating the camera sensor. At least some of the light that is emitted may include a light spectrum that is visible to the human eye, thereby providing the user with a visual indicator that indicates when the security feature is on and when the security feature is off.

Figure 3:
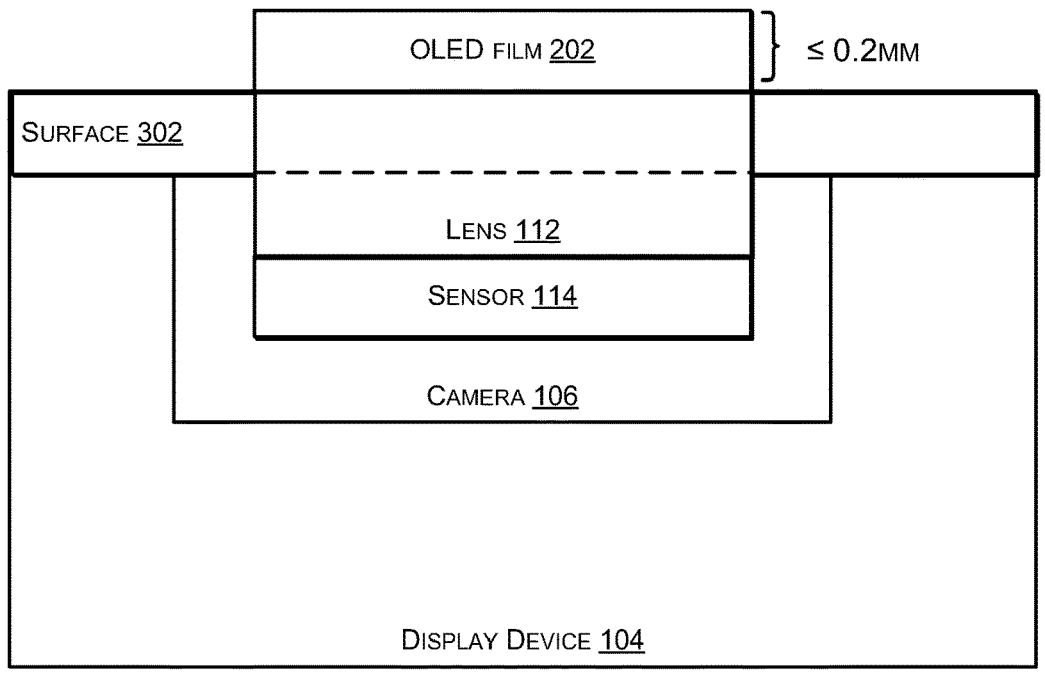
FIG. 3 is a block diagram of a display device that includes an OLED film placed over a camera lens according to some embodiments.
Figure 3:
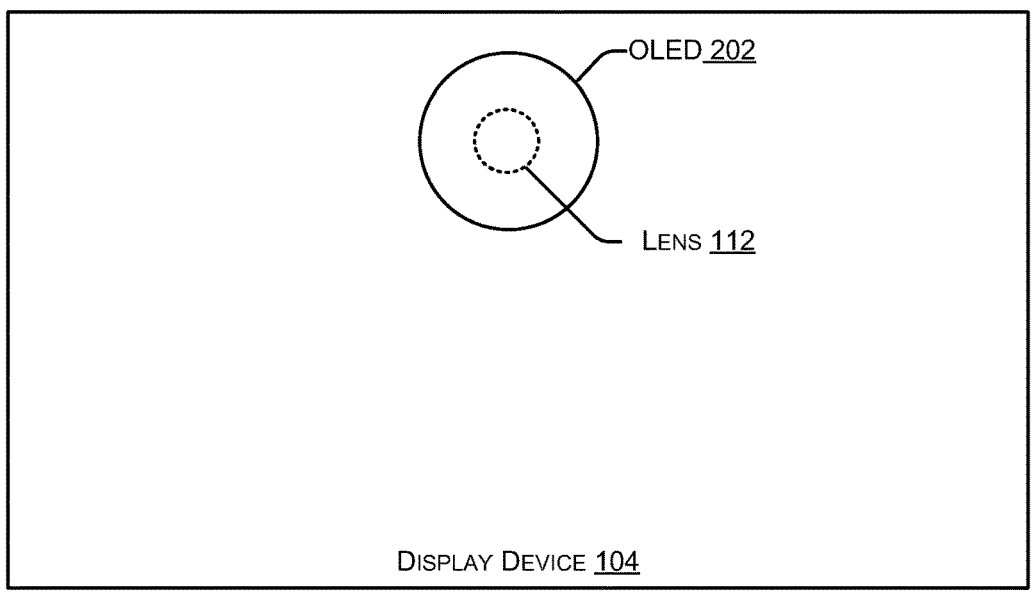

FIG. 3 is a block diagram 300 of a display device that includes an OLED film placed over a camera lens according to some embodiments. A side view of the display device 104 is illustrated in the top half of FIG. 3 and a front view of the display device 104 is illustrated in the bottom half of FIG. 3. The OLED film 202 may be no more than 0.2 millimeters (mm) thick. The OLED film 202 may be applied over (e.g., on top of) the lens 112 if the OLED film 202 does not observably or measurably degrade the image data provided by the sensor 114 when the security feature is off.

The display device 104 may include a surface 302, such as a bezel of the display device 104 or a glass (or clear plastic) of the display device 104. If the surface 302 is a bezel of the display device 104, the surface 302 may have an opening (e.g., a hole) through which the lens 112 passes (e.g., as illustrated by the solid line of lens 112 in FIG. 2). If the surface 302 is a transparent material, such as glass or clear plastic, the lens 112 may be located just below the surface 302 (as illustrated by the dashed line of lens 112 in FIG. 2).

The OLED film 202 may be applied over the lens 112, as illustrated in the front view in the bottom of FIG. 3. For example, the OLED 202 may be geometrically shaped, such as the circular shape shown in FIG. 3. The OLED 202 may have a diameter that is at least the same or greater than the diameter of the lens 112. After applying the OLED 202, the lens 112 is completed covered by (e.g., is underneath) the OLED film 202.

Figure 4:
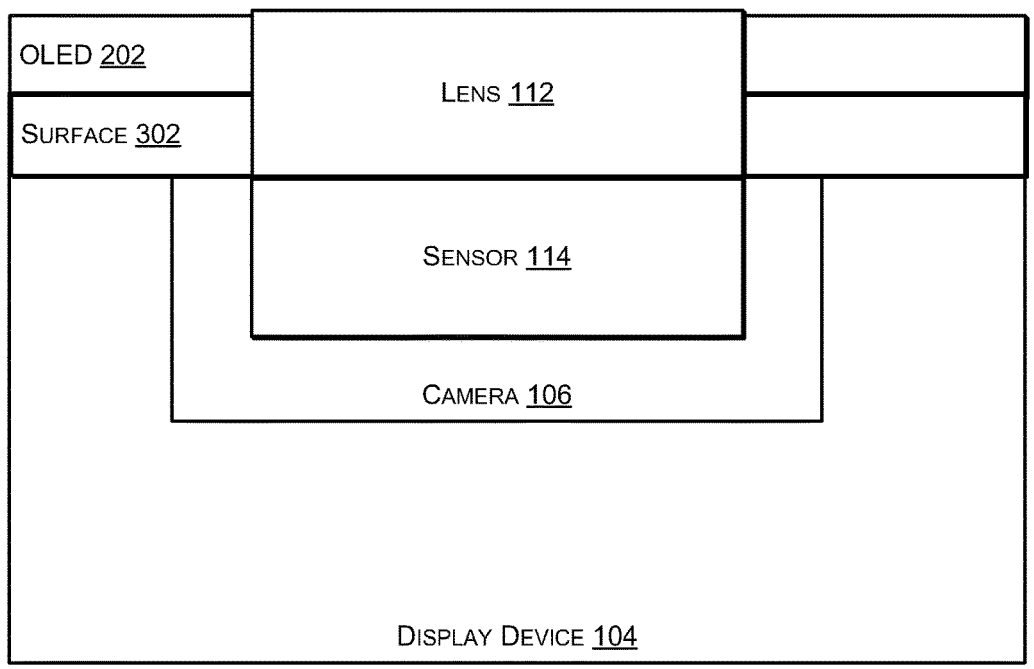
FIG. 4 is a block diagram of a display device that includes an OLED film placed around a camera lens according to some embodiments.
Figure 4:
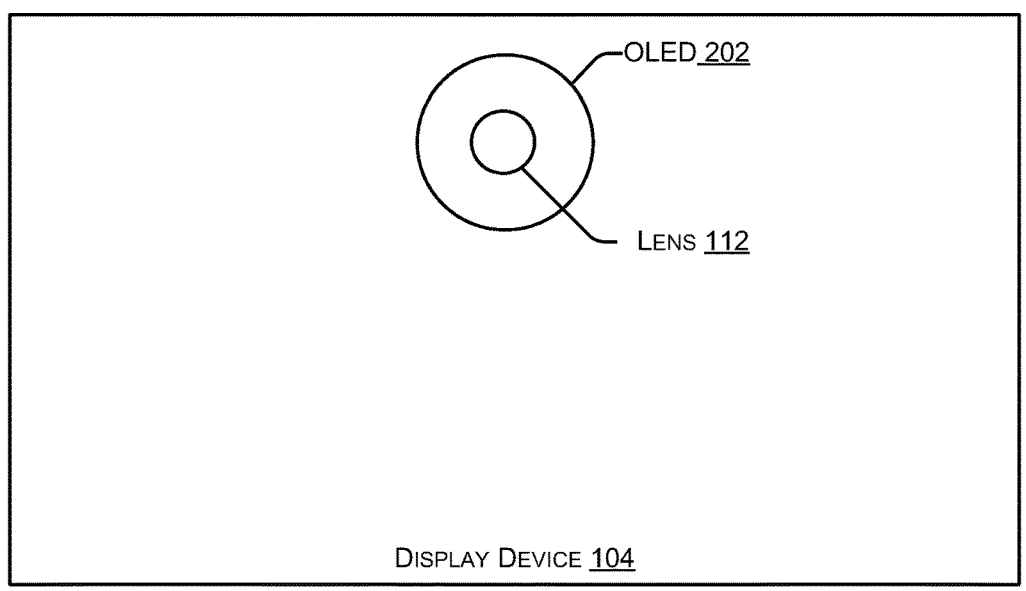

FIG. 4 is a block diagram of a display device that includes an OLED film placed around a camera lens according to some embodiments. A side view of the display device 104 is illustrated in the top half of FIG. 4 and a front view of the display device 104 is illustrated in the bottom half of FIG. 4. The OLED film 202 may be no more than 0.2 millimeters (mm) thick. The OLED film 202 may be applied around the lens 112 if the OLED film 202 observably or measurably degrades the image data provided by the sensor 114 when the security feature is off.

The display device 104 may include the surface 302, such as a bezel of the display device 104 or a glass (or clear plastic) of the display device 104. The OLED film 202 may be applied around the lens 112, as illustrated in the front view in the bottom of FIG. 3. For example, the OLED film 202 may be geometrically shaped, such as the toroidal ("doughnut") shape, e.g., a circle with a circular opening in the middle, shown in FIG. 3. The OLED film 202 may have a diameter that is greater than the diameter of the lens 112 and may include an opening in the OLED film 202 through which the lens 112 protrudes. The diameter of the opening in the OLED film 202 may be approximately the same length and width as the lens 112 to enable the lens to protrude through the OLED film 112. After applying the OLED film 202, the lens 112 protrudes through and is surrounded (but not covered) by the OLED film 202.

Figure 5:
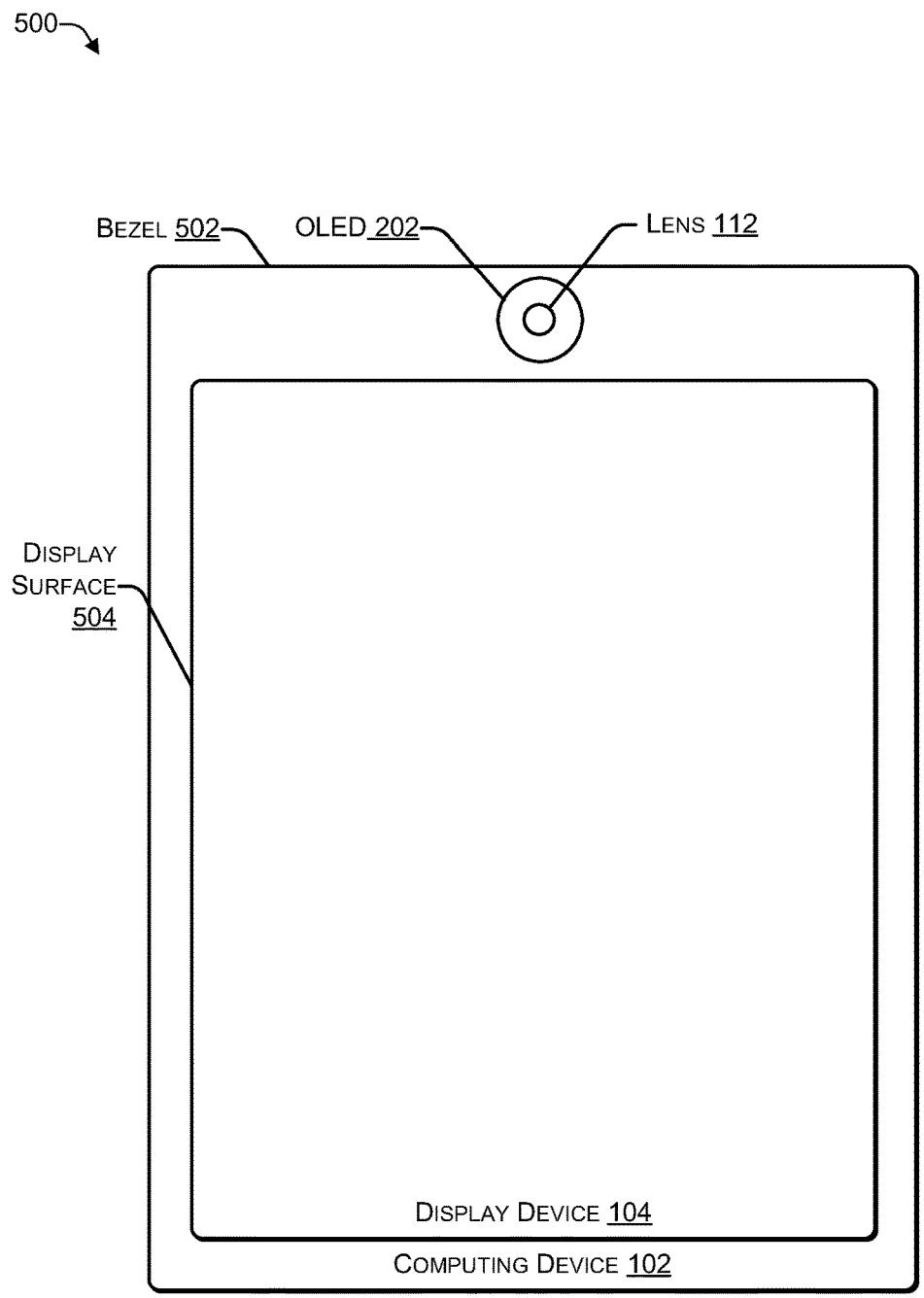
FIG. 5 is a block diagram of a camera lens integrated into a bezel of a display device according to some embodiments.

FIG. 5 is a block diagram 500 of a camera lens integrated into a bezel of a display device according to some embodiments. FIG. 5 illustrates how the lens 112 may protrude through a bezel 502 of the display device 104 (e.g., when the computing device 102 is a tablet or mobile phone). The OLED film 202 may be placed over (e.g., as show in FIG. 3) or around (e.g., as shown in FIG. 4) the lens 112. The bezel 502 may frame a display surface 504 of the display device 104.

Figure 6:
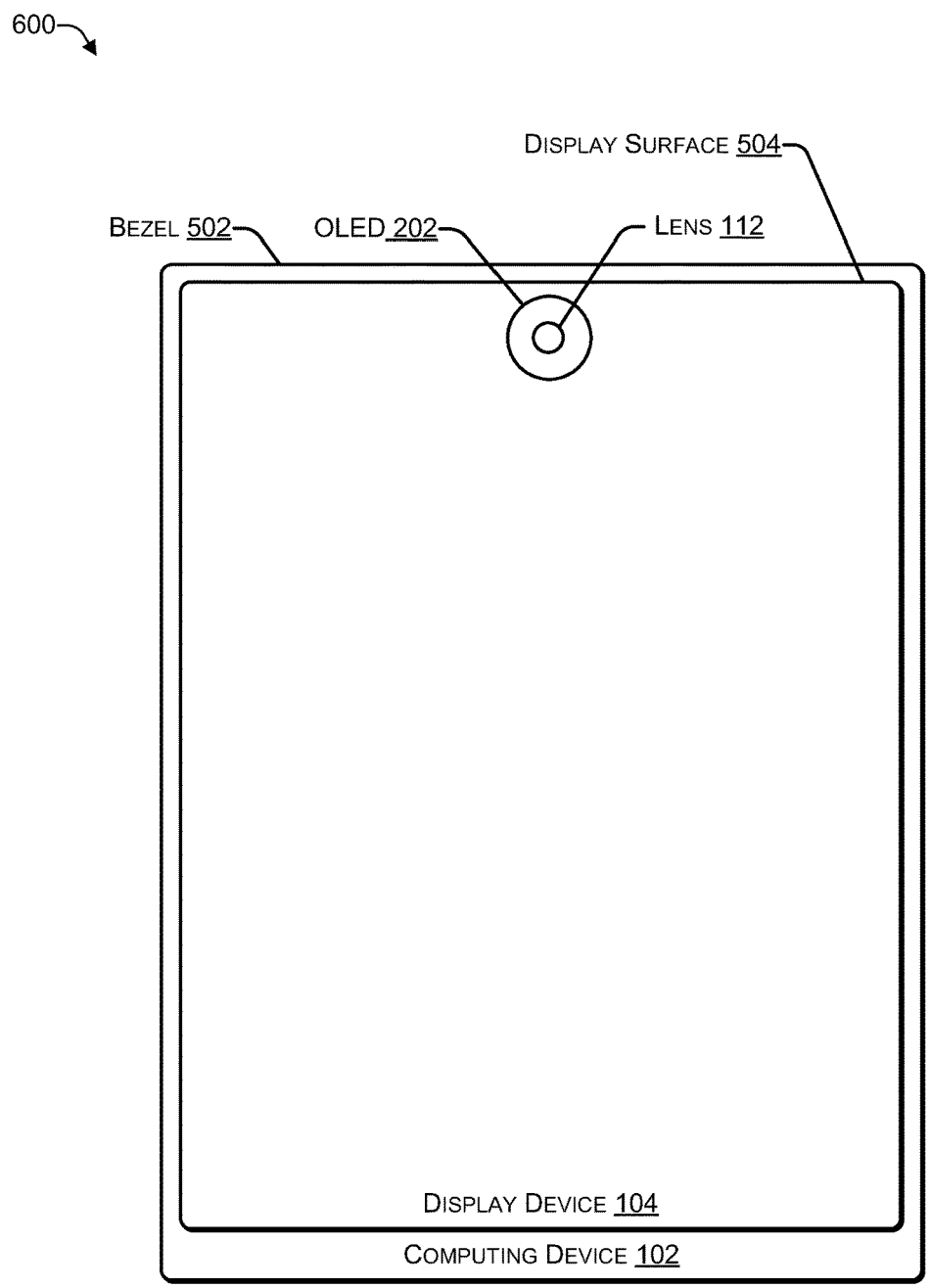
FIG. 6 is a block diagram of a camera lens integrated into a display device according to some embodiments.

FIG. 6 is a block diagram 600 of a camera lens integrated into a display device according to some embodiments. FIG. 6 illustrates how the lens 112 may be located in (e.g., integrated into) the display surface 504 (e.g., glass or clear plastic) of the display device 104. The lens 112 may be located below the display surface 504 of the display device 104 or the display surface 504 may have a, opening (e.g., hole) through which the lens 112 protrudes. The OLED film 202 may be placed over (e.g., as show in FIG. 3) or around (e.g., as shown in FIG. 4) the lens 112.

FIG. 7 is a block diagram 700 of a camera that includes an OLED film and that is connected to a computing device according to some embodiments. FIG. 7 illustrates a stand-alone version of the camera 106 that is connected to the display device 104 (or the computing device 102). In some cases, the camera 106 may be wirelessly connected (e.g., Bluetooth®, ZigBee® or other wireless data transfer protocol) to the display device 104 (or the computing device 102). In other cases, the camera 106 may be connected to a port 702 of the display device 104 (or the computing device 102) via a cable 704 (e.g., USB or other cable-based data transfer protocol). The OLED film 202 may be placed over the lens 112 (e.g., as show in FIG. 3) or around the lens 112 (e.g., as shown in FIG. 4).

Figure 8:
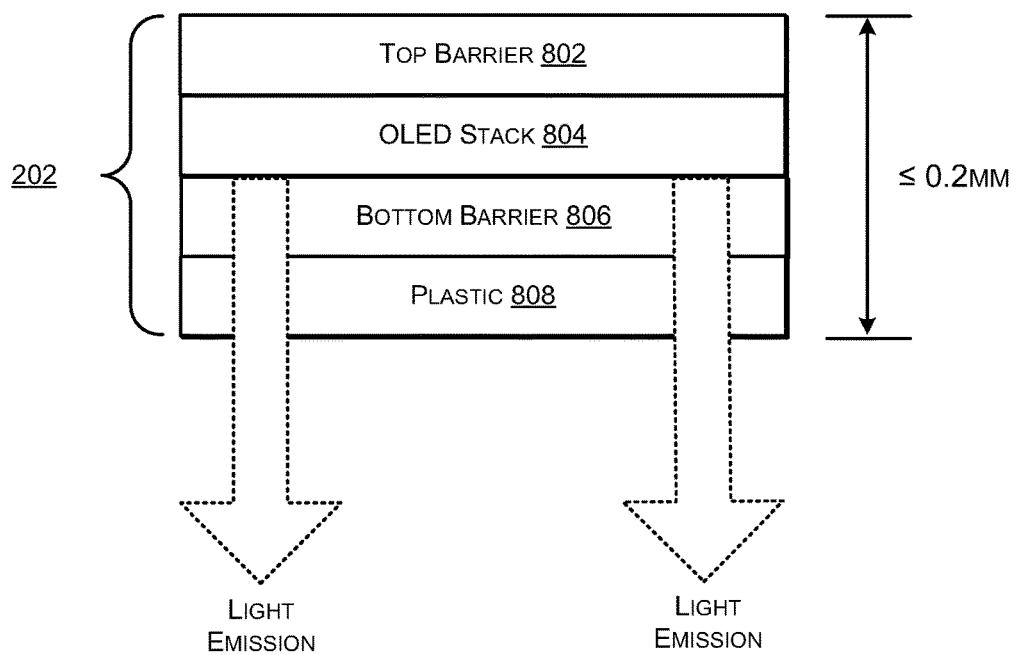
FIG. 8 is a block diagram illustrating an OLED sheet according to some embodiments.

FIG. 8 is a block diagram illustrating an OLED film according to some embodiments. For example, the OLED film 202 may include several layers, including a top moisture barrier 802, an OLED stack 804, a bottom moisture barrier 806, and plastic (e.g., polyethylene naphthalate or similar) 808. The total width of the OLED sheet 202 may be 0.2 mm or less. The OLED stack 804 may be about 100-200 nanometers (nm) in width.

The moisture barriers 802, 806 may be made of plastic (e.g., polyethylene or the like), polymer-based barrier, atomic layer deposition (ALD), or another type of moisture barrier suitable for OLED. The light emitted by the OLED stack 804 may travel through the bottom moisture barrier 806 and the plastic 808. The plastic 808 may be transparent or translucent to enable the light from the OLED stack 804 to be transmitted through the plastic 808.

Figure 9:
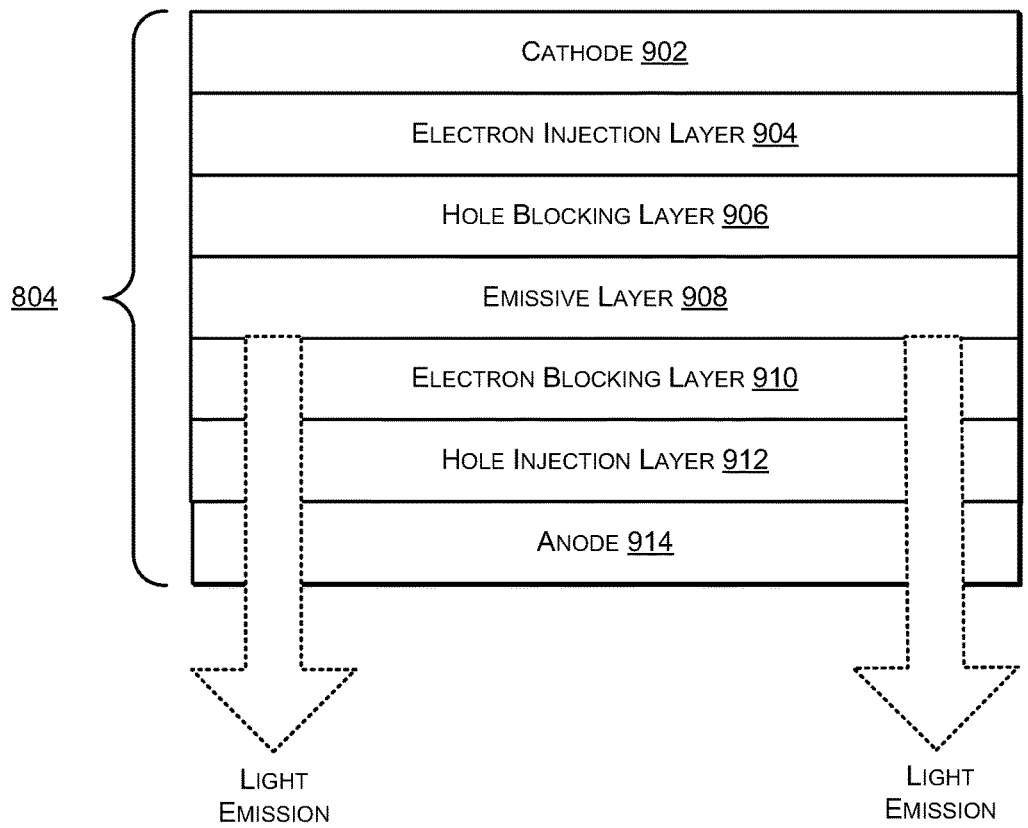
FIG. 9 is a block diagram illustrating layers of an OLED stack according to some embodiments.

FIG. 9 is a block diagram illustrating layers of an OLED stack according to some embodiments. The OLED stack 804 may be between about 100 to about 200 nanometers (nm) in width and may include a cathode (e.g., negative terminal) 902, an electron injection layer 904, a hole blocking layer 906, an emissive layer 908, an electron blocking layer 910, a hole injection layer 912, and an anode (e.g., positive terminal) 914. The cathode 902 may inject electrons into the emissive layer 908. The anode 914 may remove electrons.

Power (e.g., direct current) is provided to the OLED stack 804 via the anode 914 and cathode 902. After power is applied, the cathode 902 receives electrons from the power source and the anode removes them. The added electrons cause the emissive layer 908 to be negatively charged (similar to an n-type layer in a junction diode), while the conductive layers (the layers 910, 912) become positively charged (similar to p-type material). Positive holes jump boundary from the conductive layer (e.g., layers 904, 906) to the emissive layer 908. When a positive hole (a lack of an electron) meets an electron, the two cancel each other out, thereby releasing a brief burst of electromagnetic energy in the form of light (e.g., a photon). This process of a positive hole meeting an electron occurs many times a second, causing the OLED stack 804 to produce light when power is being applied to the cathode 902 and the anode 914.

Figure 10:
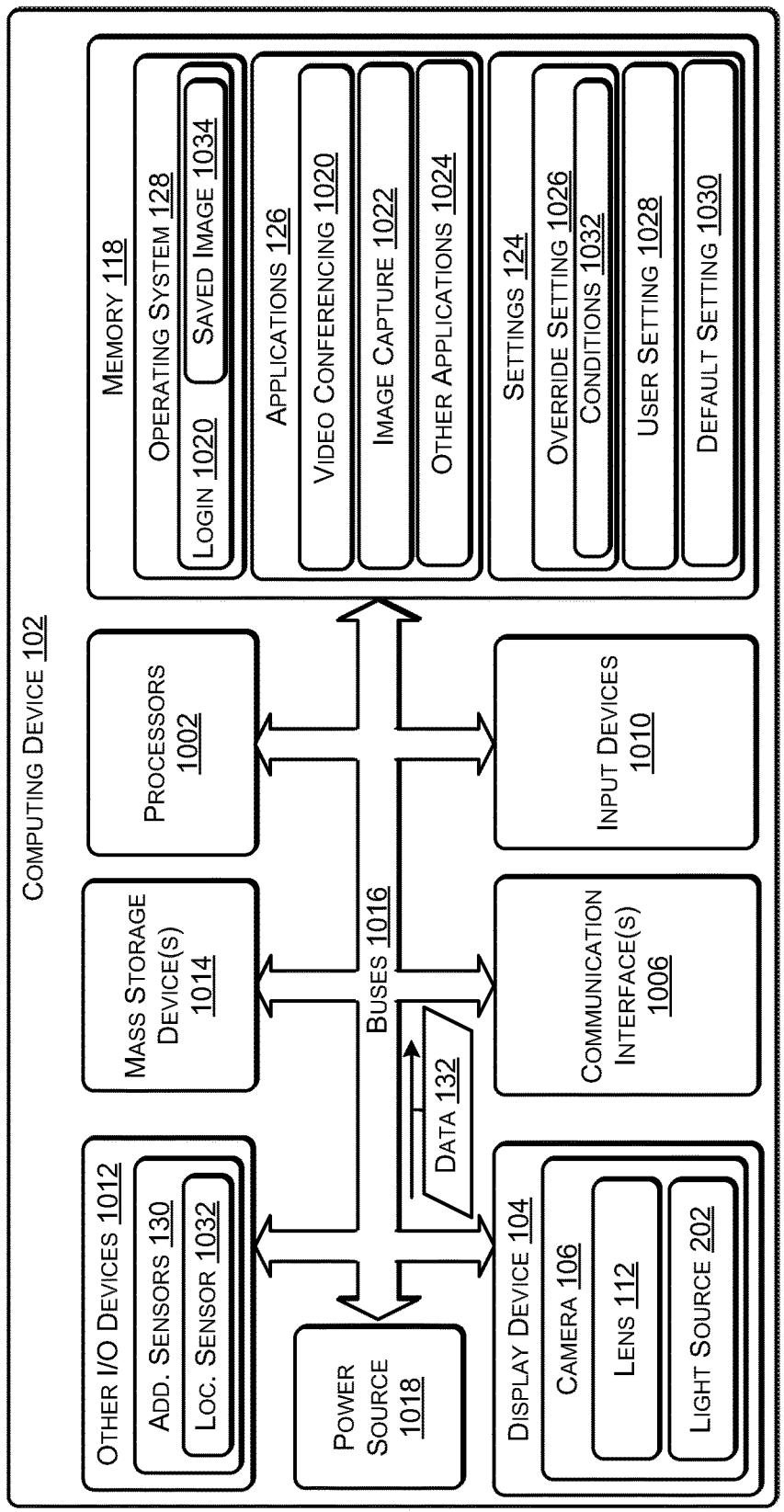
FIG. 10 illustrates an example configuration of a computing device that can be used to implement the systems and techniques described herein.

FIG. 10 illustrates an example configuration of the computing device 102 of FIG. 1 that can be used to implement the systems and techniques described herein. The computing device 102 may include one or more processors 1002 (e.g., the CPU 116 of FIG. 1, graphics processing unit (GPU) and the like), the memory 118, communication interfaces 1006 (e.g., Ethernet, Wi-Fi, and the like), the display device 104 (which, in some cases, may be connected to but separate from the computing device 102), input devices 1010 (e.g., keyboard), other input/output (I/O) devices 1012 (e.g., additional sensors 130, such as a location (e.g., GPS) sensor), and mass storage devices 1014, configured to communicate with each other, such as via one or more system buses 1016 or other suitable connections. While a single system bus is illustrated for ease of understanding, it should be understood that the system buses 1016 may include multiple buses, such as a memory device bus, a storage device bus (e.g., serial ATA (SATA) and the like), data buses (e.g., universal serial bus (USB) and the like), video signal buses (e.g., Thunder-Bolt®, DVI, HDMI, and the like), power buses, etc.

The processors 1002 are one or more hardware devices that may include a single processing unit or a number of processing units, all of which may include single or multiple computing units or multiple cores. The processors 1002 may be implemented as one or more microprocessors, microcomputers, microcontrollers, digital signal processors, central processing units, graphics processing units, state machines, logic circuitries, and/or any hardware device that can manipulate signals based on operational instructions. Among other capabilities, the processors 1002 may be configured to fetch and execute computer-readable instructions stored in the memory 118, mass storage devices 1014, or other computer-readable media.

Memory 118 and mass storage devices 1014 are examples of computer storage media (e.g., memory storage devices) for storing instructions that can be executed by the processors 1002 to perform the various functions described herein. For example, memory 118 may include both volatile memory and non-volatile memory (e.g., RAM, ROM, or the like) devices. Further, mass storage devices 1014 may include hard disk drives, solid-state drives, removable media, including external and removable drives, memory cards, flash memory, floppy disks, optical disks (e.g., CD, DVD), a storage array, a network attached storage, a storage area network, or the like. Both memory 118 and mass storage devices 1014 may be collectively referred to as memory or computer storage media herein, and may be any type of non-transitory media capable of storing computer-readable, processor-executable program instructions as computer program code that can be executed by the processors 1002 as a particular machine configured for carrying out the operations and functions described in the implementations herein.

The computing device 102 may also include one or more communication interfaces 1006 for exchanging data via a network. The communication interfaces 1006 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 1006 can also provide communication with external storage, such as a storage array, network attached storage, storage area network, cloud storage, or the like.

A power source 1018 may provide power to the various components of the computing device 102 that use power. The power source 1018 may be a power supply (e.g., that converts alternating current to direct current), a battery pack, another type of power source, or any combination thereof. For example, the power source 1018 may be used to provide power to the light source 108 of FIG. 1 or the OLED film 202 of FIG. 2.

The computer storage media, such as memory 118 and mass storage devices 1014, may be used to store software and data. For example, the computer storage media may be used to store the operating system 128, the applications 126, and the settings 124. The operating system 128 may include a login module 1020 that is executed when a user of the computing device 102 initiates a login (e.g., by booting up the computing device 102). The login module 1020 may store images of authorized users for use when the users login. For example, the login module 1020 may store a representative saved image 1034. The login module 1020 may capture the image data 132 (e.g., a current image of a user) using the camera 106 and compare the image data 132 with the saved image 1034. If the image data 132 matches (e.g., differs by less than a predetermined amount from) the saved image 1034, the user may be logged in. If the image data 132 does not match the saved image 1034, the user may not be logged in. The applications 126 may include a video conferencing application 1020, an image capture application 1022, and other software applications 1024. At least some of the applications 126, such as the video conferencing application 1020 and the image capture application 1022, may be capable of determining whether the security feature is on (e.g., whether the power source 1018 is providing power to the light source 202) and turning off the security feature if the security feature is on. The settings 124 may include at least one of an override setting 1026, a user setting 1028, or a default setting 1030. The override setting 1026 may specify one or more conditions 1032. For example, if the user or one of the applications 126 sends a request to the operating system 128 to turn off the security feature, the operating system 128 may determine whether at least one of the conditions 1032 is satisfied. If satisfied (e.g., the computing device 102 is in a location where sensitive information is present), then the operating system 128 may deny the request. If not satisfied (or the override setting 1026 is not present in the settings 124), then the operating system 128 may grant the request to enable the camera 106 to be used.

While the camera 106 is shown in FIG. 10 as being integrated into the display device 104, in some cases the camera 106 may be a standalone device that is separate from the display device 104 (e.g., as per FIG. 7). While the display device 104 is shown in FIG. 10 as being integrated into the computing device 102 (e.g., in a tablet), in some cases the display device 104 may be separate from the computing device 102 (e.g., in a laptop or desktop).

Figure 11:
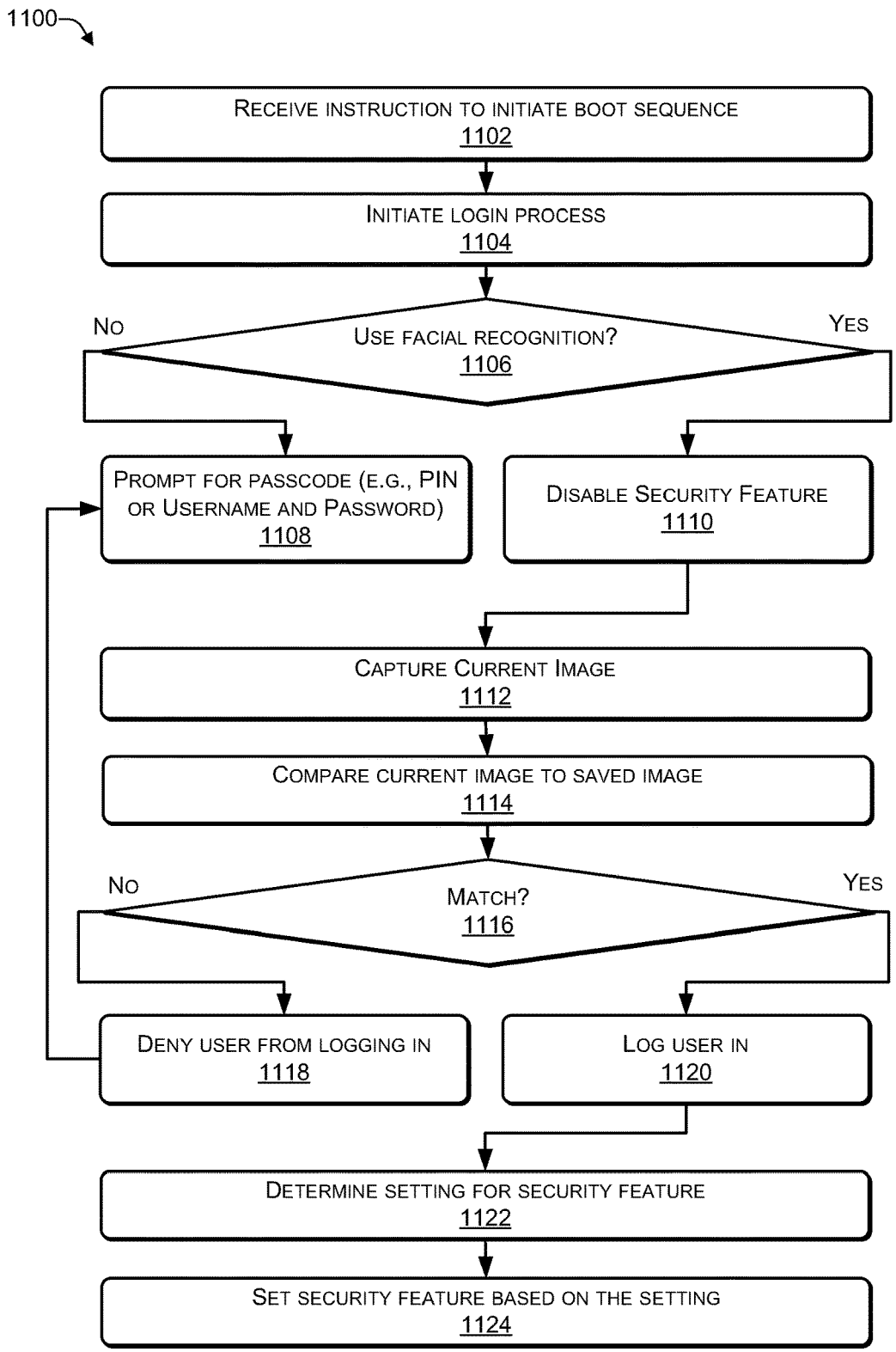
FIG. 11 is a flowchart of a login process according to some embodiments.

FIG. 11 is a flowchart of a login process 1100 according to some embodiments. For example, the process 1100 may be performed by the operating system 118 of FIG. 1, e.g., the login module 1020 of FIG. 10.

At 1102, an instruction to initiate a boot sequence of a computing device may be received. At 1104, a login process may be initiated. For example, a user may provide input to the computing device 102 of FIG. 10 to perform a "power on", "resume from suspended state (e.g., hibernation)", or the like. In response, the computing device 102 may initiate a boot sequence. The boot sequence may initiate a login process to authenticate the user and prevent unauthorized access to the computing device. For example, the computing device 102 may initiate execution of the login module 1020.

At 1106, a determination may be made whether the login process uses facial recognition to login the user. If a determination is made, at 1106, that the login process does not use facial recognition, the process may proceed to 1108, where the process initiates a conventional login process, e.g., prompting the user to enter a passcode, such as (i) a personal identification number (PIN) or (ii) a username and password.

If a determination is made, at 1106, that the login process uses facial recognition, the process may proceed to 1110, where the process disables a security feature that uses a light source to saturate a sensor of the camera to prevent the camera from providing useful information when the camera is hijacked. The security feature may be disabled to enable the login process to use the camera to capture a current image, at 1112. At 1114, the current image may be compared to a saved image.

A determination may be made (e.g., based on the comparison), at 1116, whether the current image matches (e.g., differs by less than a threshold amount from) the saved image. If a determination is made, at 1116, that the current image does not match (e.g., differs by at least a threshold amount from) the saved image, then the process may proceed to 1118, where the user is denied from logging in, and the process proceeds to 1108, where the process initiates a conventional login process, e.g., prompting the user to enter a passcode, such as (i) a personal identification number (PIN) or (ii) a username and password.

If a determination is made, at 1116, that the current image matches (e.g., differs by less than a threshold amount from) the saved image, then the process may proceed to 1120, where the user is logged in. The login module uses facial recognition to authenticate the user by comparing the current image (captured from the camera) with a previously stored image.

At 1122, a setting for a security feature (e.g., saturating the camera sensor to render images from a hijacked camera unusable) may be determined. At 1124, the security feature may be set based at least in part on the setting. For example, after the login process has completed, a determination may be made whether or not to provide power to the light source (e.g., LED or OLED). For example, a default setting may specify that the security feature is to be enabled (e.g., light source is on) by default to provide security against a hacker hijacking the camera. If a user setting is present, the user setting may override the default setting. For example, if the user frequently uses applications (e.g., videoconferencing applications, image capture applications or the like) that make use of the camera, the user may specify a user setting to disable the security feature (e.g., light source is to be off). Alternately, if the user is concerned about security and the default setting is to disable (e.g., turn off) the security feature, the user may specify a user setting to enable the security feature (e.g., light source is to be on).

In some cases, if the computing device is owned by a corporate (e.g., enterprise), an override setting may specify conditions, that when satisfied, cause the security feature to be enabled, regardless of the default setting or the user setting. For example, the conditions may specify that the security feature be enabled in locations where sensitive information is present (e.g., the corporation's research labs). In some cases, when the conditions of the override setting are satisfied, thereby causing the security setting to be enabled, the user as well as software (e.g., the operating system and applications) may not be able to modify the security setting, e.g., the user and the software may be unable to turn off (e.g., disable) the security setting. In other cases, when the conditions of the override setting are not satisfied, the user setting may be used, if the user has specified one. If the user setting has not been specified, the default setting may be used. In such cases (e.g., conditions of the override setting do not apply), the user as well as software (e.g., the operating system and applications) may be able to modify the security setting, e.g., the user and the software may be able to turn on (e.g., enable) or turn off (e.g., disable) the security setting. For example, when the user launches an application that uses the camera, the application may disable the security feature (if the security feature was enabled). When the application is shutting down, the application may re-enable the security feature. Thus, when launched, the application may determine that the security feature is enabled, disable the security feature, use the camera to capture images, and then re-enable (e.g., restore) the security feature when the application is shutting down.

Figure 12:
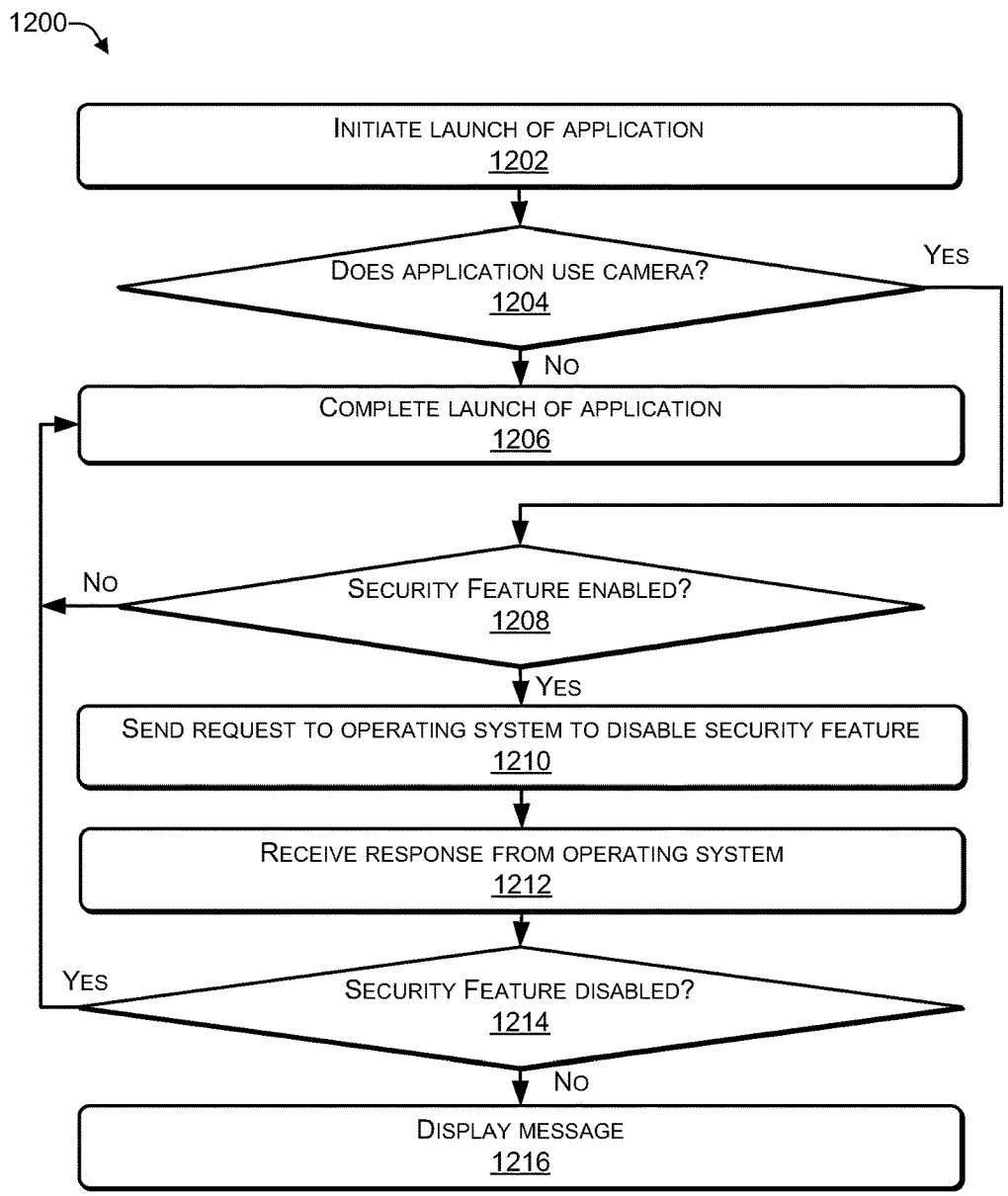
FIG. 12 is a flowchart of a process that includes launching an application according to some embodiments.

FIG. 12 is a flowchart of a process 1200 that includes launching an application according to some embodiments. For example, the process 1200 may be performed by one of the applications 126 or the operating system 128.

At 1202, an application (e.g., one of the applications 126) may be launched. At 1204, a determination may be made whether the application uses a camera. If a determination is made, at 1204, that the application does not use a camera, then the process proceeds to 1206, where the launch of the application is completed.

If a determination is made, at 1204, that the application uses a camera, then the process proceeds to 1208, where a determination is made whether a security feature is enabled. For example, the process may determine whether power is being provided to a light source, causing the light to saturate a sensor of the camera. If a determination is made, at 1208, that the security feature is not enabled, then the process proceeds to 1206, where the launch of the application is completed.

If a determination is made, at 1208, that the security feature is enabled (e.g., causing the camera to render unusable image data), then the process proceeds to 1210, where the process sends a request to disable the security feature to an operating system. For example, the process may request that the operating system cause the EC 120 of FIG. 1 to stop providing power to the light source to enable the camera to provide usable image data for the application to use. In response to receiving the request, the operating system may determine whether the conditions of an override setting are satisfied. For example, a corporation (e.g., enterprise) may use the override setting to specify that, for each corporate computing device, the security feature be enabled at particular locations. The security feature may be enabled to prevent sensitive or confidential information from being viewed, in the event that the camera of the computing device is hijacked.

At 1212, a response may be received from the operating system. For example, if the operating system determines that the conditions of the override setting are satisfied, the response may indicate that the security cannot be disabled. If the operating system determines that the conditions of the override setting are not satisfied (e.g., do not apply), the operating system may disable the security feature, and send a response indicating that the security has been disabled. For example, the operating system may instruct an embedded controller to cut off power to the light source, thereby causing the light source to stop emitting light, enabling the sensor to provide image data that the application can use.

At 1214, a determination is made whether the response from the operating system indicates that the security feature has been disabled. In response to determining, at 1214, that the security feature has been disabled, the process may proceed to 1206 to complete the launch of the application. In response to determining, at 1214, that the security feature has not been disabled, at 1216, the process may display a message to inform the user that the image-related features of the application are not be usable. For example, the process may display a message indicating that at least some of the image-related features of the application are not be usable because conditions of the override setting have been satisfied. In some cases, the process may proceed to 1206 and the launch of the application may be completed, even though at least some of the image-related features of the application may not be usable. For example, the user may launch a video conferencing application. The user may be able to see the other participants in the video conference but the other participants may receive image data from the saturated imaging sensor of the camera (e.g., the other participants may not be able to see the user). In other cases, the process may end after 1216, e.g., without completing the launch of the application. For example, the user may launch a data capture application (e.g., still image or video stream capture) that is not usable if the camera sensor is saturated. If the security feature cannot be disabled, the application may not complete launch and the message may explain that the application is not usable because the security feature cannot be disabled (e.g., because the user is in a location where the user's employer has specified that the security feature be enabled).

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An information handling system comprising:
   a computing device comprising:
     a processor; and
     a memory;
   a display device; and
   a camera comprising:
     a light source;
     a lens; and
     an imaging sensor;
   wherein the memory includes instructions that are executable by the processor to perform operations comprising:
     determining that a security feature is enabled, wherein the security feature causes the light source to saturate the imaging sensor such that an unauthorized user accessing the camera views distorted data that is unusable to determine information associated with a user of the computing device;
     based on determining that the security feature is enabled, providing power to the light source to cause the light source to emit an amount of light sufficient to saturate the imaging sensor;
     initiating execution of a software application;
     based on determining that the software application uses the camera, automatically disabling the security feature to enable the software application to use the camera; and
     after determining that the software application is no longer executing, automatically re-enabling the security feature.

2. The information handling system of claim 1, wherein the light source comprises an organic light emitting diode (OLED) film.

3. The information handling system of claim 2, wherein: the OLED film is geometrically shaped and placed over the lens.

4. The information handling system of claim 2, wherein:
the OLED film is geometrically shaped and includes an opening through which the lens protrudes; and
the OLED film is placed around the lens.

5. The information handling system of claim 2, wherein: a thickness of the OLED film is 0.2 millimeters or less.

6. The information handling system of claim 2, wherein:
the OLED film has a capacitive sensing property; and
touching the OLED film causes the OLED film to transition (i) from a power on state to a power off state when the OLED film is emitting light or (ii) from the power off state to the power on state when the OLED film is not emitting light.

7. The information handling system of claim 1, further comprising:
a light pipe to transport light from the light source to a location that is sufficiently near the lens to cause the imaging sensor to be saturated when the light source is emitting light.

8. The information handling system of claim 1, wherein the software application comprises one of:
an operating system that uses facial recognition during a login process;
a video conferencing application; or
a camera application.

9. The information handling system of claim 1, wherein:
the camera is a standalone device that is connected to the computing device;
the camera is integrated into a bezel of the display device, or
the camera is integrated into a display surface of the display device.

10. A computing device comprising:
a processor;
a memory;
a display device; and
a camera comprising:
 a lens;
 an imaging sensor; and
 an organic light emitting diode (OLED) film;
wherein the memory includes instructions that are executable by the processor to perform operations comprising:
 determining that a security feature is enabled, wherein the security feature causes the OLED film to saturate the imaging sensor such that an unauthorized user accessing the camera views distorted data that is unusable to determine information associated with a user of the computing device;
 based on determining that the security feature is enabled, providing power to the OLED film to cause the OLED film to emit an amount of light sufficient to saturate the imaging sensor;
 initiating execution of a software application;
 based on determining that the software application uses the camera, automatically disabling the security feature; and
 based on determining that the software application has completed execution, automatically re-enabling the security feature.

11. The computing device of claim 10, further comprising:
providing, by the light emitted by the OLED film, a visual indication that the OLED film is causing the imaging sensor to be saturated.

12. The computing device of claim 10, wherein the light emitted by the OLED film comprises (i) a first set of light frequencies that are visible to a user and (ii) a second set of light frequencies that are not visible to a user.

13. The computing device of claim 10, wherein:
when the OLED film is being provided the power, touching the OLED film causes a capacitance sensing property of the OLED film to stop providing the power, causing the OLED film to stop emitting the light; and
when the OLED film is not being provided the power, touching the OLED film causes the capacitance sensing property of the OLED film to provide the power, causing the OLED film to emit the light.

14. The computing device of claim 10, wherein:
the OLED film has a circular shape; and
the OLED film is either:
 placed over the lens, or
 the OLED film includes an opening through which the lens protrudes.

15. A camera comprising:
a lens;
an imaging sensor; and
an organic light emitting diode (OLED) film;
wherein the camera is communicatively coupled to a computing device comprising:
 one or more processors; and
 a memory storing instructions that are executable by the one or more processors to perform operations comprising:
  determining that a security feature is enabled, wherein the security feature causes the OLED film to saturate the imaging sensor such that an unauthorized user accessing the camera views distorted data that is unusable to determine information associated with a user of the computing device;
  based on determining that the security feature is enabled, providing power to the OLED film to cause the OLED film to emit an amount of light sufficient to saturate the imaging sensor;
  initiating execution of a software application;
  based on determining that the software application uses the camera, automatically disabling the security feature; and
  based on determining that the software application has completed execution, automatically re-enabling the security feature.

16. The camera of claim 15, wherein:
the camera is a standalone device that is connected to a computing device.

17. The camera of claim 15, wherein:
the camera is integrated into a bezel of a display device of a computing device.

18. The camera of claim 15, wherein:
the OLED film has a capacitive sensing property;
when the OLED film is emitting light, touching the OLED film causes the capacitive sensing property to detect the touching and stop the OLED film from emitting the light; and
when the OLED film is not emitting light, touching the OLED film causes the capacitive sensing property to detect the touching and cause the OLED film to emit the light.

19. The camera of claim 15, wherein the software application comprises one of:
an operating system that uses facial recognition during a login process;
a video conferencing application; or
a camera application.

20. The camera of claim 15, further comprising:
providing, by a visible portion of the light emitted by the OLED film, a visual indication that the OLED film is causing the imaging sensor to be saturated; and
wherein an invisible portion of the light emitted by the OLED film causes the imaging sensor to be saturated.

* * * * *